(12) United States Patent
Tsai

(10) Patent No.: US 12,733,154 B2
(45) Date of Patent: Sep. 8, 2026

(54) MEMORY DEVICE AND FABRICATION METHOD THEREOF

(71) Applicant: NANYA TECHNOLOGY CORPORATION, New Taipei City (TW)

(72) Inventor: Jhen-Yu Tsai, Kaohsiung City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 401 days.

(21) Appl. No.: 18/377,785

(22) Filed: Oct. 7, 2023

(65) Prior Publication Data

US 2025/0120070 A1 Apr. 10, 2025

(51) Int. Cl.
*H10B 12/00* (2023.01)

(52) U.S. Cl.
CPC ....... *H10B 12/488* (2023.02); *H10B 12/0387* (2023.02); *H10B 12/315* (2023.02); *H10B 12/482* (2023.02)

(58) Field of Classification Search
CPC . H10B 12/0387; H10B 12/315; H10B 12/488
See application file for complete search history.

(56) References Cited

U.S. PATENT DOCUMENTS

| | | | | |
|---|---|---|---|---|
| 2019/0198676 | A1* | 6/2019 | Hsieh | H10D 30/60 |
| 2020/0395363 | A1 | 12/2020 | Kim et al. | |
| 2020/0395455 | A1* | 12/2020 | Kim | H10D 64/513 |
| 2022/0216213 | A1* | 7/2022 | Huang | H10B 12/34 |
| 2022/0254381 | A1 | 8/2022 | Li | |
| 2023/0031281 | A1* | 2/2023 | Liu | H10B 12/488 |
| 2023/0118276 | A1* | 4/2023 | Wang | H10B 12/053 257/296 |
| 2023/0411475 | A1* | 12/2023 | Tsai | H10D 64/513 |

FOREIGN PATENT DOCUMENTS

| | | | |
|---|---|---|---|
| TW | 202218060 | A | 5/2022 |
| TW | 202221898 | A | 6/2022 |

* cited by examiner

*Primary Examiner* — Steven M Page
(74) *Attorney, Agent, or Firm* — CKC & Partners Co., LLC

(57) ABSTRACT

A memory device comprises a substrate; a first word line structure, a first dielectric layer; a dielectric liner, and a bit line structure. The first word line structure is in the substrate and comprises a first bottom conductive material and a first top conductive material, in which a top surface of the first bottom conductive material is wider than a bottom surface of the first top conductive material. The first dielectric layer is over the first word line structure. The dielectric liner lines the first word line structure. The bit line structure is over the substrate.

9 Claims, 14 Drawing Sheets

MEMORY DEVICE AND FABRICATION METHOD THEREOF

BACKGROUND

Semiconductor devices, such as memory devices, Dynamic Random Access Memory (DRAM) for storage of information, or others, are currently in widespread use, in a myriad of applications. The DRAM include a plurality of DRAM cells, each of which includes a capacitor for storing information and a transistor coupled to the capacitor for regulating the timing of when the capacitor is charged or discharged. During a read operation, a word line (WL) is asserted, turning on the transistor. The enabled transistor allows the voltage across the capacitor to be read by a sense amplifier through a bit line (BL). During a write operation, the data to be written is provided on the BL when the WL is asserted.

SUMMARY

One aspect of the present disclosure provides a memory device, comprising a substrate, a first word line structure, a first dielectric layer, a dielectric liner, and a bit line structure. The first word line structure is in the substrate and includes a first bottom conductive material and a first top conductive material over the first bottom conductive material, in which a top surface of the first bottom conductive material is wider than a bottom surface of the first top conductive material. The first dielectric layer is over the first word line structure. The dielectric liner lines the first word line structure. The bit line structure is over the substrate.

In some embodiments, the first dielectric layer is in contact with the bottom conductive material.

In some embodiments, the top conductive material has a first sidewall and a second sidewall opposite to the first sidewall, the first sidewall is in contact with the first dielectric layer and the second sidewall is in contact with the dielectric liner.

In some embodiments, a bottom surface of the first dielectric layer is lower than a top surface of the first top conductive material.

In some embodiments, the memory device further comprises a capacitor electrically coupled with a doped region of the substrate.

In some embodiments, a portion of the top surface of the first bottom conductive material is free of coverage by the first top conductive material.

In some embodiments, the first dielectric layer is in contact with a top surface of the first top conductive material and a sidewall of the first top conductive material.

In some embodiments, the memory device further includes an isolation structure in the substrate. A second word line structure in the isolation structure, comprising: a second bottom conductive material, and a second top conductive material over the second bottom conductive material, in which a top surface of the second bottom conductive material and a bottom surface of the second top conductive material have substantially a same width.

In some embodiments, the second top conductive material is wider than the first top conductive material.

In some embodiments, the memory device further comprises a second dielectric layer over the second top conductive material, in which the first dielectric layer is in contact with a portion of the first bottom conductive material, while the second dielectric layer is spaced apart from the second bottom conductive material.

One aspect of the present disclosure provides a fabrication method of a memory device, comprising: forming a first trench in a substrate; forming a first dielectric liner lining the first trench; forming a first bottom conductive material over the first dielectric liner; forming a first top conductive material over the first bottom conductive material; removing a portion of the first top conductive material to expose a portion of the first bottom conductive material; forming a first dielectric layer over a remaining portion of the first top conductive material; and forming a bit line structure over the substrate.

In some embodiments, a material of the first top conductive is different from a material of the first bottom conductive material.

In some embodiments, forming the bit line structure further comprises: forming a recess in the substrate; depositing a first conductive layer to fill the recess; depositing a second conductive layer over the first conductive layer; and patterning the second conductive layer and the first conductive layer.

In some embodiments, removing the portion of the first top conductive material comprises: forming a patterned mask over the substrate, in which the patterned mask exposes the portion of the first top conductive material while covering another portion of the first top conductive material; etching the portion of the first top conductive material through the patterned mask; and removing the patterned mask.

In some embodiments, the method further comprises etching back the first top conductive material prior to removing the portion of the first top conductive material.

In some embodiments, the first dielectric layer is in contact with a top surface and a sidewall of the remaining portion of the first top conductive material.

In some embodiments, the remaining portion of the first top conductive material comprises a first sidewall and a second sidewall opposite to the first sidewall, the first sidewall is in contact with the first dielectric layer, and the second sidewall is in contact with the first dielectric liner.

In some embodiments, the method further comprises: forming an isolation structure in the substrate; forming a second trench in the isolation structure; forming a second dielectric liner lining the second trench; forming a second bottom conductive material over the second dielectric liner; and forming a second top conductive material over the second bottom conductive material, in which after removing the portion of the first top conductive material, the remaining portion of the first top conductive material is narrower than the second top conductive material.

In some embodiments, the method further comprises forming a second dielectric layer over the second top conductive material, in which the second dielectric layer is spaced apart from the second bottom conductive material through the second top conductive material.

In some embodiments, removing the portion of the first top conductive material comprises: forming a patterned mask over the substrate, in which the patterned mask exposes the portion of the first top conductive material while covering the second top conductive material; etching the portion of the first top conductive material through the patterned mask, in which during etching the portion of the first top conductive material, the second top conductive material is protected by the patterned mask; and removing the patterned mask.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
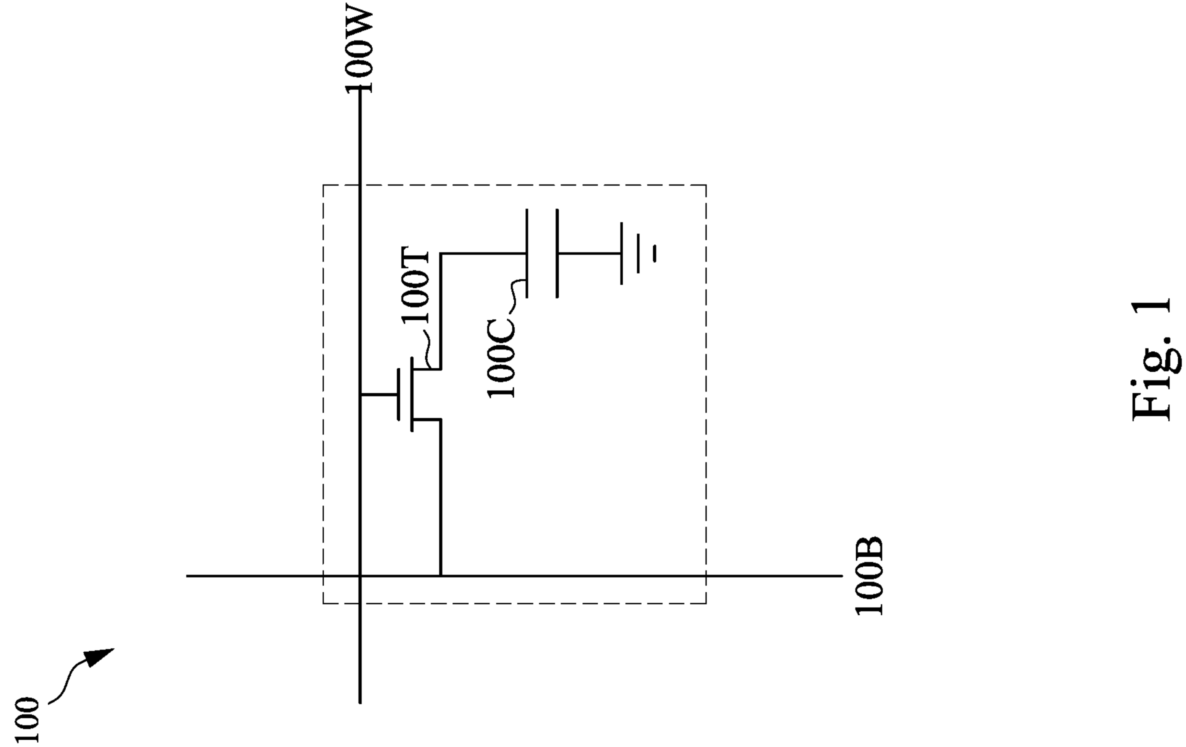
FIG. 1 is a circuit diagram of a memory cell of a memory device in accordance with some embodiments of the present disclosure.

Reference will now be made in detail to the present embodiments of the invention, examples of which are illustrated in the accompanying drawings. Wherever possible, the same reference numbers are used in the drawings and the description to refer to the same or like parts.

FIG. 1 is a circuit diagram of a memory cell of a memory device in accordance with some embodiments of the present disclosure. Shown there is a memory device 100 including at least one memory cell 102. In some embodiments, the memory device 100 is a dynamic random access memory (DRAM) device. The memory cell 102 of the memory device 100 includes a transistor 100T and a capacitor 100C as main structures. The one side of capacitor 100C is coupled with the drain region of the transistor 100T and the other side of the capacitor 100C is coupled to the ground. The memory device 100 further includes a word-line 100W coupled with the gate region of the transistor 100T, and a bit-line 100B coupled with the source of the transistor 100T. The operation of devices can be achieved by utilization of a word-line 100W and a bit-line 100B, and the storage of data can be accomplished by controlling the charges in the capacitor 100C. The charge transportation over the capacitor 100C can be determined by the control of transistor 100T, which may be manipulated by the bit-line 100B and the word-line 100W to characterize the reading and writing of the signal.

Figure 2:
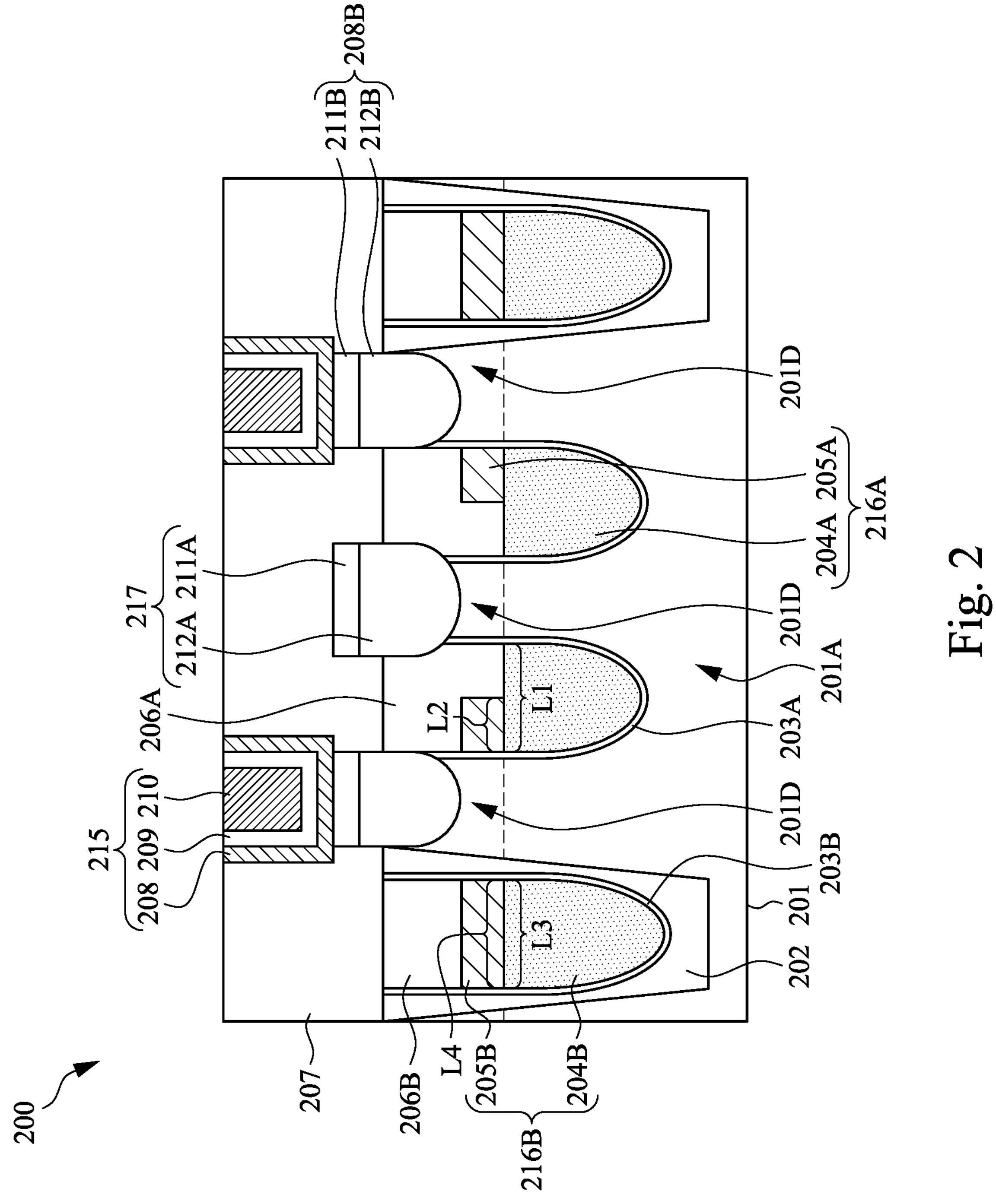
FIG. 2 is a cross-sectional view of a memory device in accordance with some embodiments of the present disclosure.

FIG. 2 is a cross-sectional view of a memory device in accordance with some embodiments of the present disclosure. Shown there is a memory device 200. In some embodiments, the cross-sectional view of the memory device 200 may be an example of the memory device 100 as discussed in FIG. 1.

The memory device 200 includes a substrate 201. In some embodiments, the substrate 201 can be suitable semiconductive material, such as silicon, silicon carbide, gallium arsenic, gallium phosphide, germanium, indium antimonide, indium phosphide, indium arsenide, or the like. The substrate 201 may also be doped with suitable dopants. For example, the substrate 201 may be doped with p-type dopants, such as boron (B), gallium (Ga), indium (In), aluminium (Al), or the like. In other embodiments, the substrate 201 may be doped with n-type dopants, such as phosphorus (P), arsenic (As), or antimony (Sb), or the like.

Isolation structures 202 are disposed within the substrate 201. The isolation structures 202 can be suitable isolation structures, such as shallow trench isolation (STI) structures. In the cross-sectional view of FIG. 2, shown there are two isolation structures 202 that define an active area 201A where at least one transistor is formed thereon. In some embodiments, the isolation structures 202 may be made of suitable dielectric material, such as silicon oxide, silicon nitride or the like.

The memory device 200 further includes a plurality of word line structures 216A and 216B. In greater detail, in the cross-sectional view of FIG. 2, the word line structures 216A are embedded in the active area 201A of the substrate 201, while the word line structures 216B are embedded in the isolation structures 202.

The memory device 200 further includes dielectric layers 206A over the respective word line structures 216A, and dielectric liners 203A lining the respective word line structures 216A and the respective dielectric layers 206A. In some embodiments, the dielectric layers 206A may include suitable dielectric material, such as silicon oxide, silicon nitride or the like. In some embodiments, the dielectric liners 203A may include suitable dielectric material, such as silicon oxide, silicon nitride or the like.

Similarly, the memory device 200 further includes dielectric layers 206B over the respective word line structures 216B, and dielectric liners 203B lining the respective word line structures 216B and the respective dielectric layers 206B. The materials of the dielectric layers 206B and the dielectric liners 203B may be similar to those described with respect to the dielectric layers 206B and the dielectric liners 203B, and thus relevant details will not be repeated for brevity.

In some embodiments, each of the word line structures 216A includes a bottom conductive material 204A and a top conductive material 205A over the bottom conductive material 204A. In some embodiments, the bottom conductive material 204A and the top conductive material 205A are made of different materials. In some embodiments, the bottom conductive material 204A may include suitable conductive material, such as cobalt, nickel, titanium, titanium nitride, tungsten, tungsten nitride, the like, or the combination thereof. For example, in some embodiments, the combination of titanium nitride and tungsten are used as the bottom conductive material 204A. In some embodiments, the top conductive material 205A may be suitable material to reduce the band-bending between the active area 201A and the dielectric liner 203A. The top conductive material 205A may be a semiconductive material or conductive material. In some embodiments, polysilicon is used for the top conductive material 205A. In some other embodiments, doped polysilicon is used for the top conductive material 205A.

The top surface of the bottom conductive material 204A has a width L1, and the bottom surface of the top conductive material 205A has a width L2. In some embodiments, the width L1 is greater than the width L2. That is, at least a portion of the top surface of the bottom conductive material 204A is free of coverage by the top conductive material 205A. As a result, at least a portion of the top surface of the bottom conductive material 204A is in contact with the dielectric layer 206A. In some embodiments, the dielectric layer 206A may be in contact with a sidewall and a top surface of the top conductive material 205A. In some embodiments, the top conductive material 205A has opposite first and second sidewalls, in which the first sidewall is in contact with the dielectric liner 203A, and the second sidewall is in contact with the dielectric layer 206A. In some embodiments, a bottom surface of the dielectric layer 206A is lower than a top surface of the top conductive material 205A. Although the top conductive material 205A is illustrated having a rectangular cross-section, the present disclosure is not limited thereto. In other embodiments, the cross-section of the top conductive material 205A can also be half-circle, triangle, trapezoid, reverse-trapezoid, irregular.

With respect to the word line structures 216B, each of the word line structures 216B includes a bottom conductive material 204B and a top conductive material 205B over the bottom conductive material 204B. The materials of the bottom conductive material 204B and the top conductive material 205B may be similar to those described with respect to the bottom conductive material 204A and the top conductive material 205A, and thus relevant details will not be repeated for brevity.

The word line structure 216B is different from the word line structure 216A, in that the top surface of the bottom conductive material 204B has a width L3, and the bottom surface of the top conductive material 205B has a width L4, and the width L3 is substantially the same as the width L4. That is, an entirety of the top surface of the bottom conductive material 204B is covered by the top conductive material 205B. As a result, an entirety of the bottom conductive material 204B may be vertically separated from the dielectric layer 206B through the top conductive material 205B. In some embodiments, the top conductive material 205B may be wider than the top conductive material 205A, and the width L4 may be larger than the width L2.

The memory device 200 further includes doped regions 201D within the active area 201A of the substrate 201, in which a pair of doped regions 201D are disposed on opposite sides of the word line structures 216A. In some embodiments, the doped regions 201D may include opposite conductivity type than the substrate 201. For example, when the substrate 201 is a p-type substrate, the doped regions 201D may be n-type doped regions. Similarly, when the substrate 201 is an n-type substrate, the doped regions 201D may be p-type doped regions.

Here, the word line structure 216A, the dielectric liner 203A, the pair of doped regions 201D on opposite sides of the word line structure 216A, and the active area 201A of the substrate 201 may collective serve as the transistor of the memory device 200 (e.g. the transistor 100T of FIG. 1). In greater detail, the word line structure 216A may serve as the gate electrode of the transistor, the dielectric liner 203A may serve as the gate dielectric of the transistor, the active area 201A of the substrate 201 may serve as the channel region of the transistor, and the doped regions 201D may serve as source/drain regions of the transistor.

The memory device 200 further includes a bit line structure 217 over the substrate 201 and electrically coupled with one of the doped regions 201D. In some embodiments, the bit line structure 217 may include a buried contact 212A and a bit line 211A over the buried contact 212A. In some embodiments, the buried contact 212A has a portion embedded in the substrate 201 and a portion protruding from the substrate 201. In some embodiments, a material of the buried contact 212A may be doped silicon or polysilicon. In some embodiments, a material of the bit line 211A may be suitable conductive material, such as tungsten, tungsten nitride, titanium nitride, the like, or the combination thereof.

The memory device 200 further includes capacitor contact structures 218 over the substrate 201 and electrically coupled with the doped regions 201D. In some embodiments, each of the capacitor contact structures 218 may include a buried contact 212B and a metal contact 211B over the buried contact 212B. In some embodiments, the buried contact 212B has a portion embedded in the substrate 201 and a portion protruding from the substrate 201. In some embodiments, the materials of the buried contact 212B and the metal contact 211B may be similar to those described with respect to the buried contact 212A and bit line 211A, and thus relevant details will not be repeated for brevity.

The memory device 200 further includes capacitor structures 215 over the respective capacitor contact structures 218. In some embodiments, each of the capacitor structures 215 includes a lower electrode 208, a middle dielectric 209, and an upper electrode 210, in which the middle dielectric 209 is disposed between the upper electrode 210 and the lower electrode 208. In some embodiments, the lower electrode 208 and the middle dielectric 209 may include U-shape cross-section.

The memory device 200 further includes a dielectric layer 207 over the substrate 201 and laterally surrounding the bit line structure 217, the capacitor contact structures 218, and the capacitor structures 215. In some embodiments, the dielectric layer 207 may be formed of, for example, silicon oxide, borophosphosilicate glass, undoped silicate glass, fluorinated silicate glass, low-k dielectric materials, the like, or a combination thereof.

Embodiments of the present disclosure provide a memory device, in which a portion of the top conductive material 205A of the word line structure 216A is removed. This will result in that the overlying dielectric layer 206A has a thicker portion between the word line structure 216A and the bit line structure 217, which in turn will reduce the capacitance between the word line structure 216A and the bit line structure 217. Moreover, the thicker dielectric layer 206A at the edge of the word line structure 216A can also reduce the electric field when the word line structure 216A is turn-off, and will further improve current leakage from the bit line structure 217 to the substrate 201.

FIGS. 3 to 14 are cross-sectional views at various stages of forming a memory device in accordance with some embodiments in the present disclosure. In greater detail, FIGS. 3 to 14 illustrate a method for forming the memory device 200 as discussed in FIG. 2. Accordingly, similar elements are labeled the same, and relevant details will not be repeated for brevity.

Figure 3:
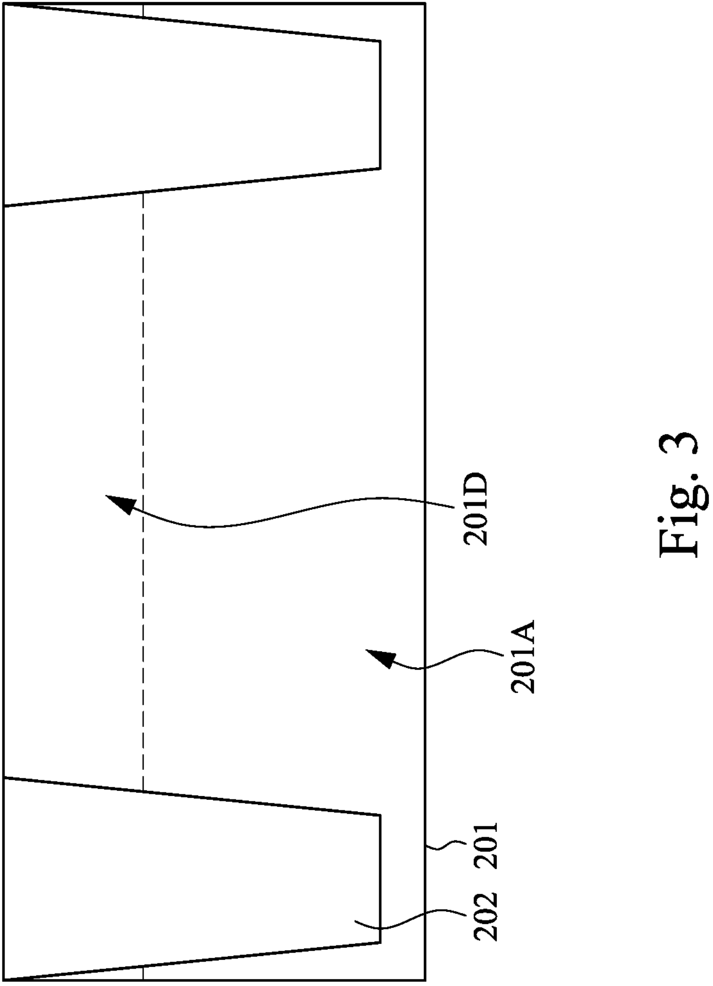
FIGS. 3 to 14 are cross-sectional views at various stages of forming a memory device in accordance with some embodiments in the present disclosure.
Figure 3:
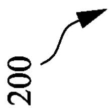

Referring to FIG. 3, a substrate 201 is provided. Isolation structures 202 are formed in the substrate 201 to define an active area 201A. For example, a series of deposition processes may be performed to deposit a pad oxide layer (not shown) and a pad nitride layer (not shown) over the substrate 201. A photolithography process may be performed to define the positions of the isolation structures 202. After the photolithography process, an etch process, such as an anisotropic dry etch process, may be performed to form trenches penetrating through the pad oxide layer, the pad nitride layer, and the substrate 201. In some embodiments, the cleaning process may be performed by suitable cleaning method, such as wet clean. An insulating material may be deposited into the trenches and a planarization process, such as chemical mechanical polishing, may be subsequently performed to remove excess filling material until the substrate 201 is exposed. After the isolation structures 202 are formed, a doped region 201D may be formed within the active area 201A of the substrate 201 through an implantation process.

Figure 4:
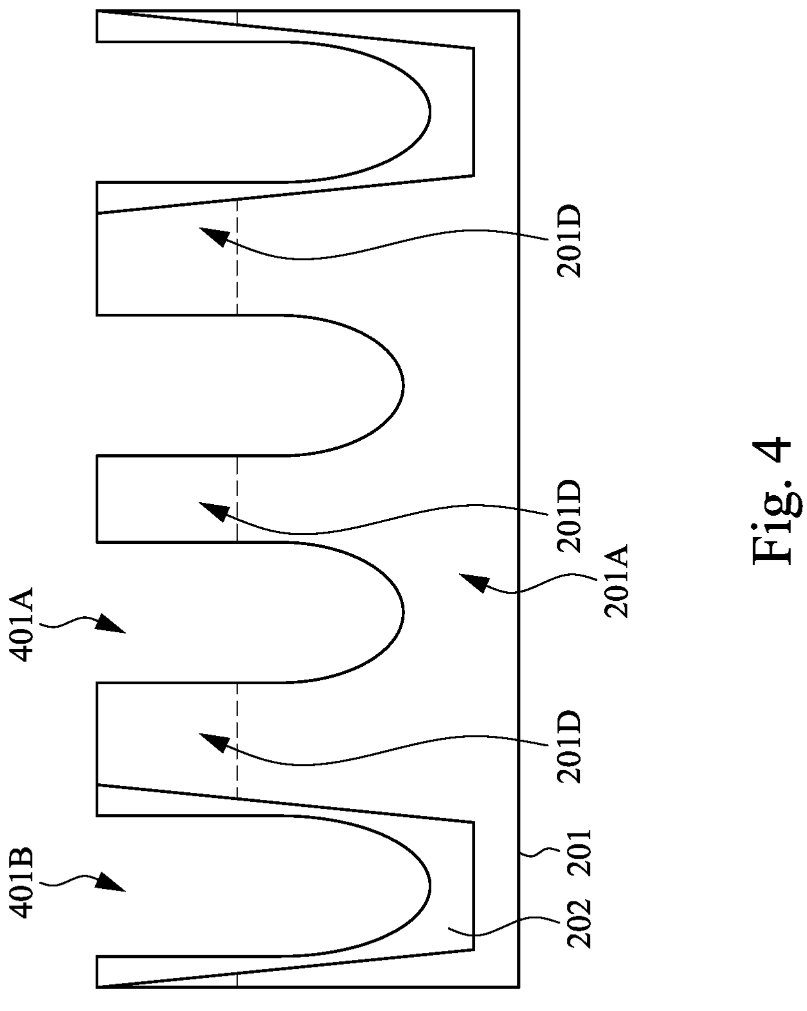
Figure 4:
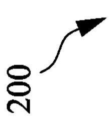

Referring to FIG. 4, trenches 401A and 401B are formed in the substrate 201 and the isolation structures 202, respectively. In some embodiments, a patterned mask (e.g., photoresist) is formed over the substrate 201, in which the patterned mask may include openings that define the positions of the trenches 401A and 401B. Afterwards, an etching process may be performed from the openings of the patterned mask to remove portions of the substrate 201 and the isolation structures 202, so as to form the trenches 401A and 401B. In some embodiments, the etching process may be suitable etching process, such as wet etch or dry etch. In some embodiment, the anisotropic etching process may be performed, such as RIE, DRIE, or the like. In some embodiments, the aspect ratio of trench 401A may be different from (or the same as) the aspect ratio of trench 401B.

Figure 5:
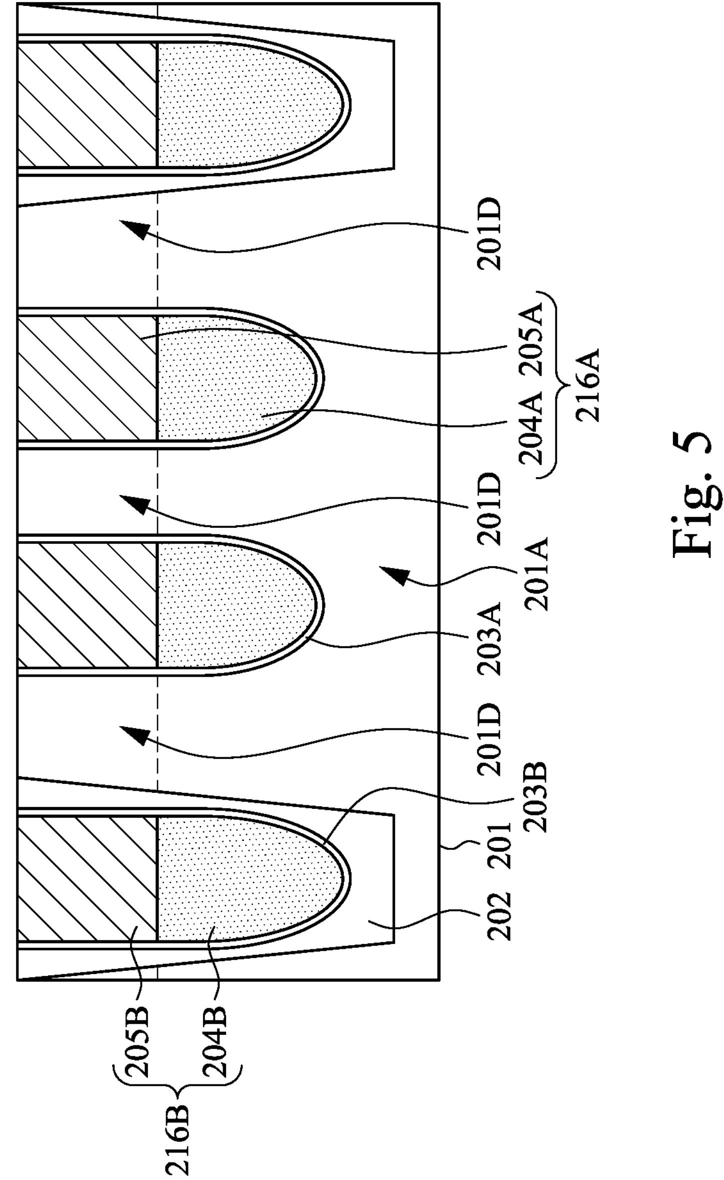

Referring to FIG. 5, dielectric liners 203A and word line structures 216A are formed in the trenches 401A, and dielectric liners 203B and word line structures 216B are formed in the trenches 401B, respectively. The word line structure 216A includes a bottom conductive material 204A and a top conductive material 205A over the bottom conductive material 204A. The word line structure 216B includes a bottom conductive material 204B and a top conductive material 205B over the bottom conductive material 204B.

In some embodiment, a first deposition process may be performed to form a material of the dielectric liner 203A and 203B over the substrate 201 and lining sidewalls of the trenches 401A and 401B. In some embodiments, the first deposition process may be suitable deposition method, such as CVD, PECVD, low pressure CVD (LPCVD), ultra-high vacuum CVD (UHVCVD), atomic layer deposition (ALD), or the like.

Afterwards, a second deposition process may be performed to form a material of the bottom conductive materials 204A and 204B over the substrate 201 and overfilling the trenches 401A and 401B. Then, an etching back process is performed to lower top surface of the material of the bottom conductive materials 204A and 204B.

Then, a third deposition process may be performed to form a material of the top conductive materials 205A and 205B and overfilling the trenches 401A and 401B.

After the third deposition process, a planarization process, such as CMP, may be performed on the material of the top conductive materials 205A and 205B until the substrate 201 is exposed. As a result, a top surface of the substrate 201, a top surface of top conductive material 205A, a top surface of top conductive material 205B, and a top surface of isolation structure 202 are substantially coplanar. In some embodiments, a cleaning process may be performed after the planarization process.

Figure 6:
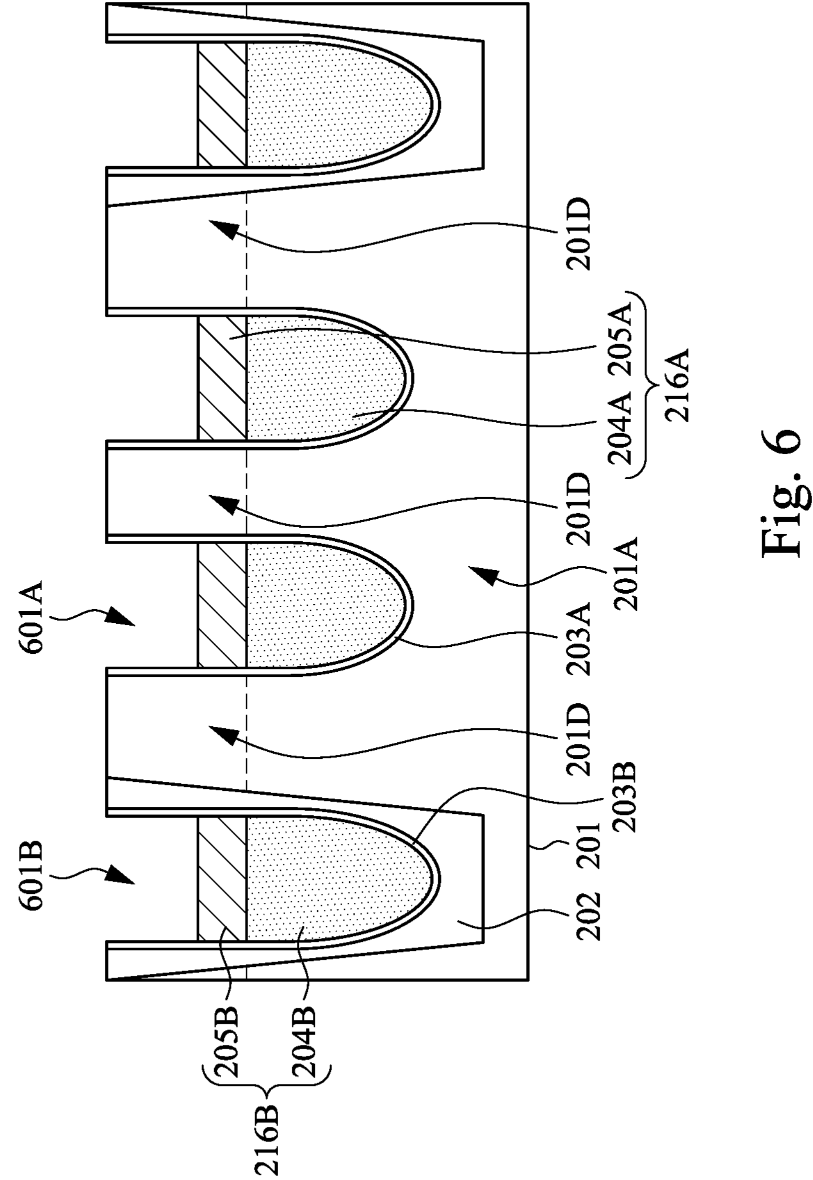

Referring to FIG. 6, the etching back process may be performed to lower top surfaces of the top conductive materials 205A and 205B to form recesses 601A and 601B over the word line structures 216A and 216B, respectively.

Figure 7:
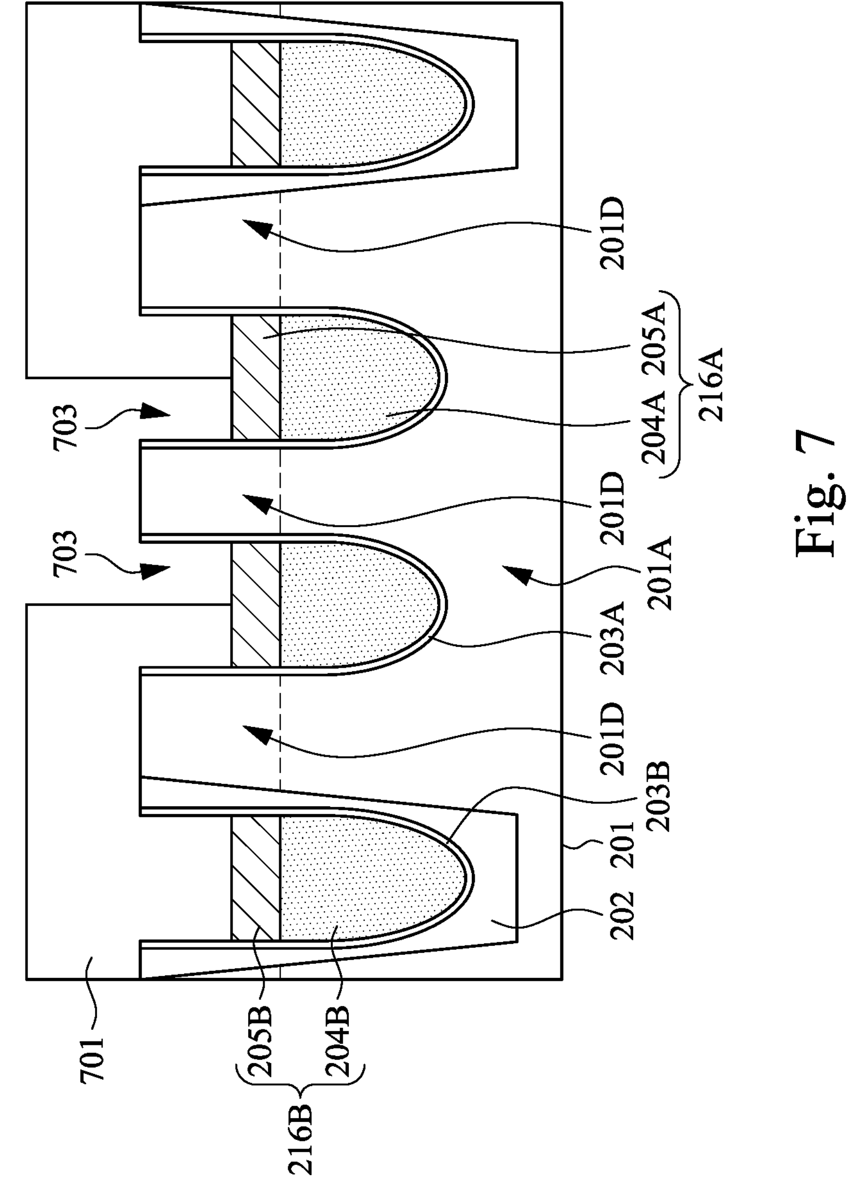

Referring to FIG. 7, a patterned mask 701 may be formed over the substrate 201, filling the recesses 601B and portions of the recesses 601A. The patterned mask 701 may include an opening 703 exposing portions of the top conductive materials 205A of the word line structures 216A. In some embodiment, the patterned mask 701 may cover the top conductive materials 205B, the surface of substrate 201, the surface of isolation structures 202, and the top conductive materials 205A. In some embodiment, a portion of top conductive material 205A may be covered by the patterned mask 701 and another portion of top conductive material 205A may be exposed through the opening 703. In some embodiments, the patterned mask 701 may include photoresist, hard mask, or the like.

Figure 8:
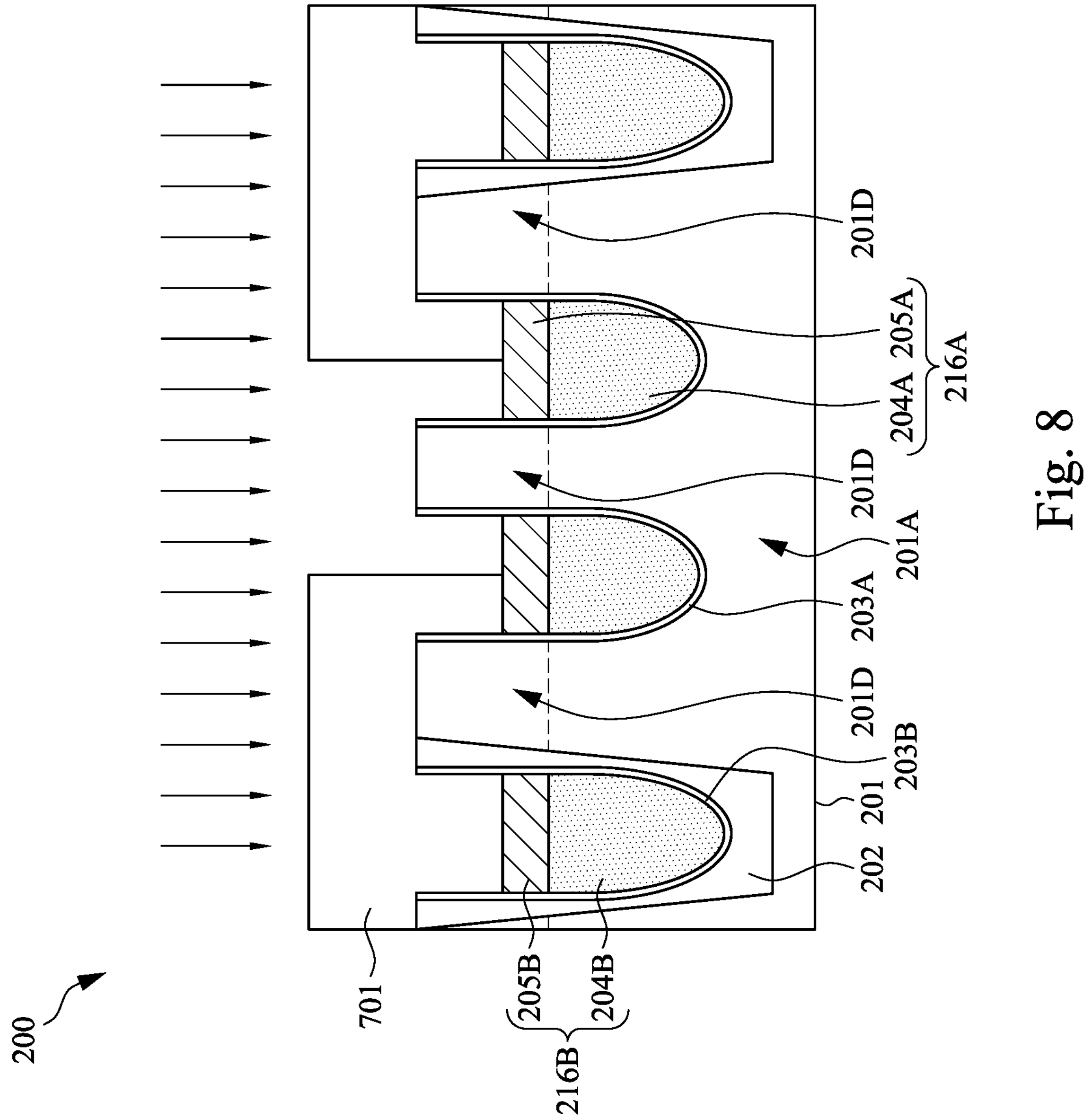

Referring to FIG. 8, an etching process may be performed to etch the exposed portions of top conductive materials 205A, such that portions of the underlying bottom conductive materials 204A are exposed. In some embodiments, the etching process may be performed by suitable etching method, such as wet etch, dry etch or the combination of thereof. In some embodiments, the wet etch may be performed with suitable wet etchant, such as hydrofluoric acid, phosphorous acid, sulfuric acid, nitric acid, acetic acid, the like, or the combination of thereof. In some embodiments, additives may be provided with the wet etchant, such as ammonia hydroxide, hydrogen peroxide, the like, or the combination of thereof. In some embodiments, the etching process may be performed by suitable dry etch method, such as plasma etching, RIE, DRIE, neutral beam etch (NBE). In some embodiments, the anisotropic dry etch method may be performed with suitable etchant gases, such as fluorine, chlorine, bromine, fluoromethane, chloromethane, bromomethane, hydrogen halide, the like, or the combination thereof. In some embodiments, gas additives may be provided with the etchant gases, such as sulfur oxide, sulfur fluoride, boron chloride, carbonhydride, oxygen, hydrogen, the like, or the combination thereof. As a result of the etching process, recesses 901 are formed over the top conductive materials 205A, respectively.

Figure 9:
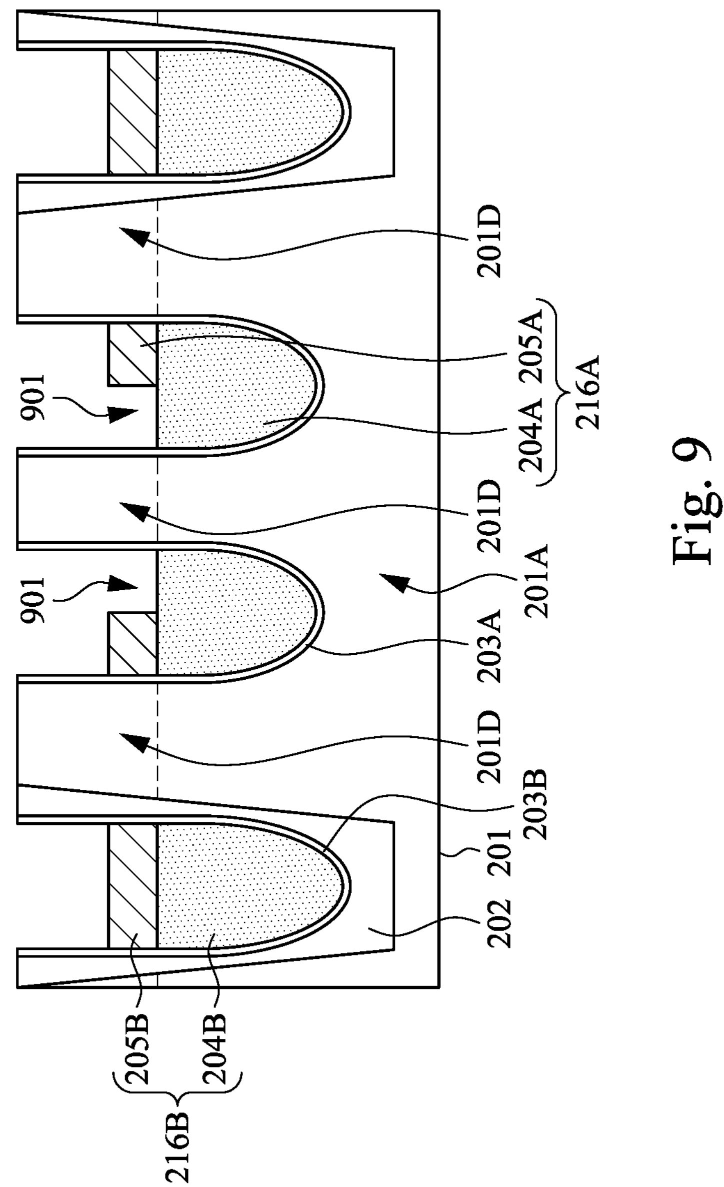

Referring to FIG. 9, a removing process may be performed to remove the patterned mask 701 after the etching process. In some embodiments, the removing process of patterned mask 701 may performed by suitable removing method, such as wet clean process with suitable solution or organic solvent. In some embodiments, the removing process may be performed by a plasma cleaning method, such as ashing method.

Figure 10:
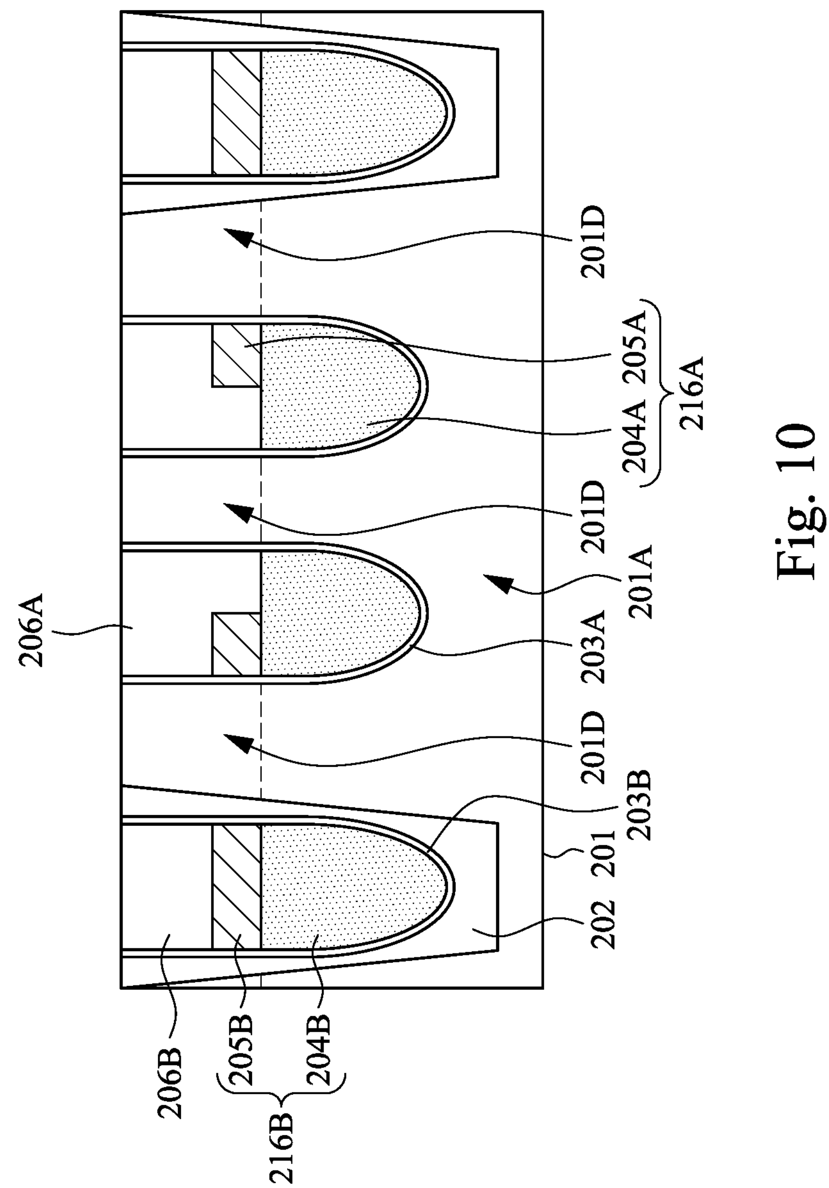

Referring to FIG. 10, dielectric layers 206A and 206B are formed over the word line structures 216A and 216B, respectively. In some embodiments, a deposition process may be performed to forma dielectric material over the substrate 201 and covering the word line structures 216A and 216B. Then, a planarization process may be performed to remove excess dielectric material until the substrate 201 is exposed. In some embodiments, the planarization process may be performed to make a top surface of the dielectric layer 206A and the top surface of dielectric layer 206B coplanar with the surface of the substrate 201.

Figure 11:
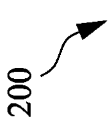
Figure 11:
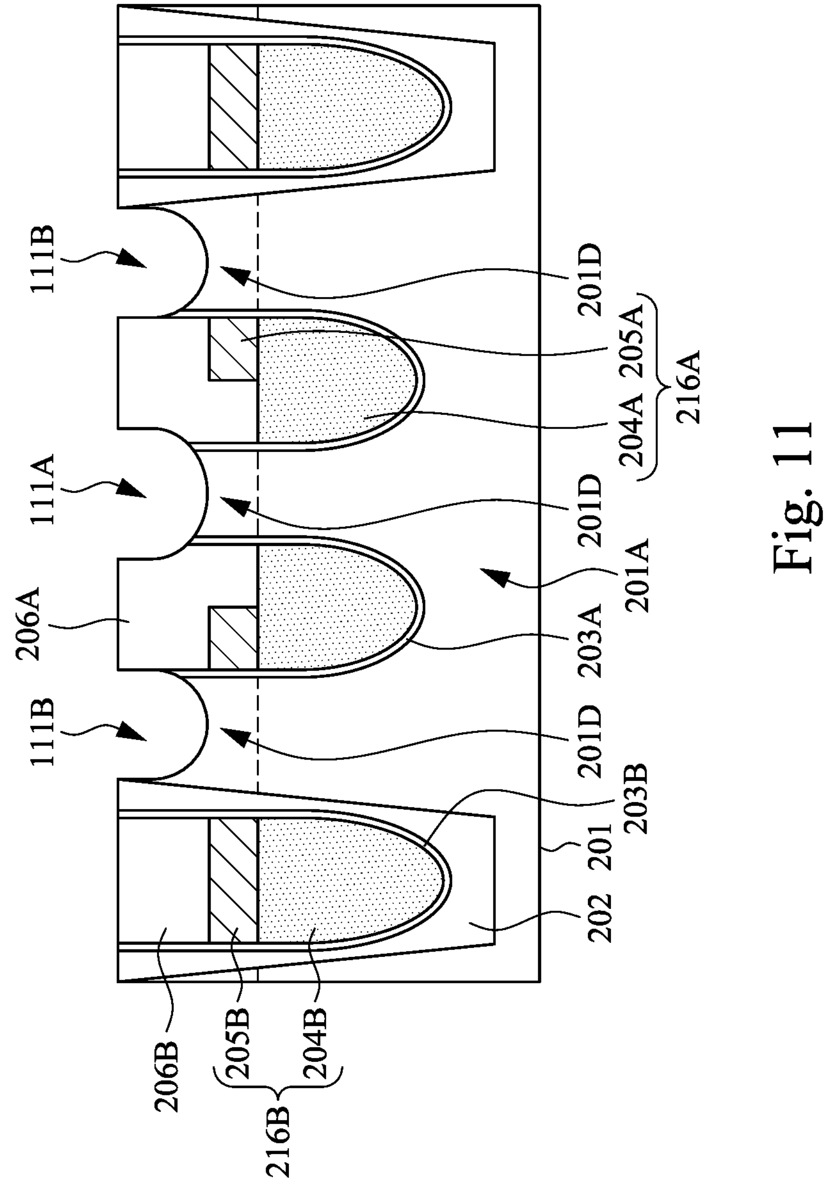

Referring to FIG. 11, recesses 111A and recesses 111B are formed in the doped regions 201D of the substrate 201. In some embodiments, the bottom of the recesses 111A and 111B may be higher than the top surface of the top conductive material 205A. In some embodiments, a patterned mask (not shown) is formed over the substrate 201, and an etching process is performed to remove portions of the substrate 201 exposed through the patterned mask to form the recesses 111A and 111B. In some embodiments, a clean process may be performed to after the etching process. In some embodiments, the recess 111A may be formed between adjacent dielectric layers 206A. In some embodiments, the recess 111B may be formed between adjacent dielectric layers 206A and 206B.

Figure 12:
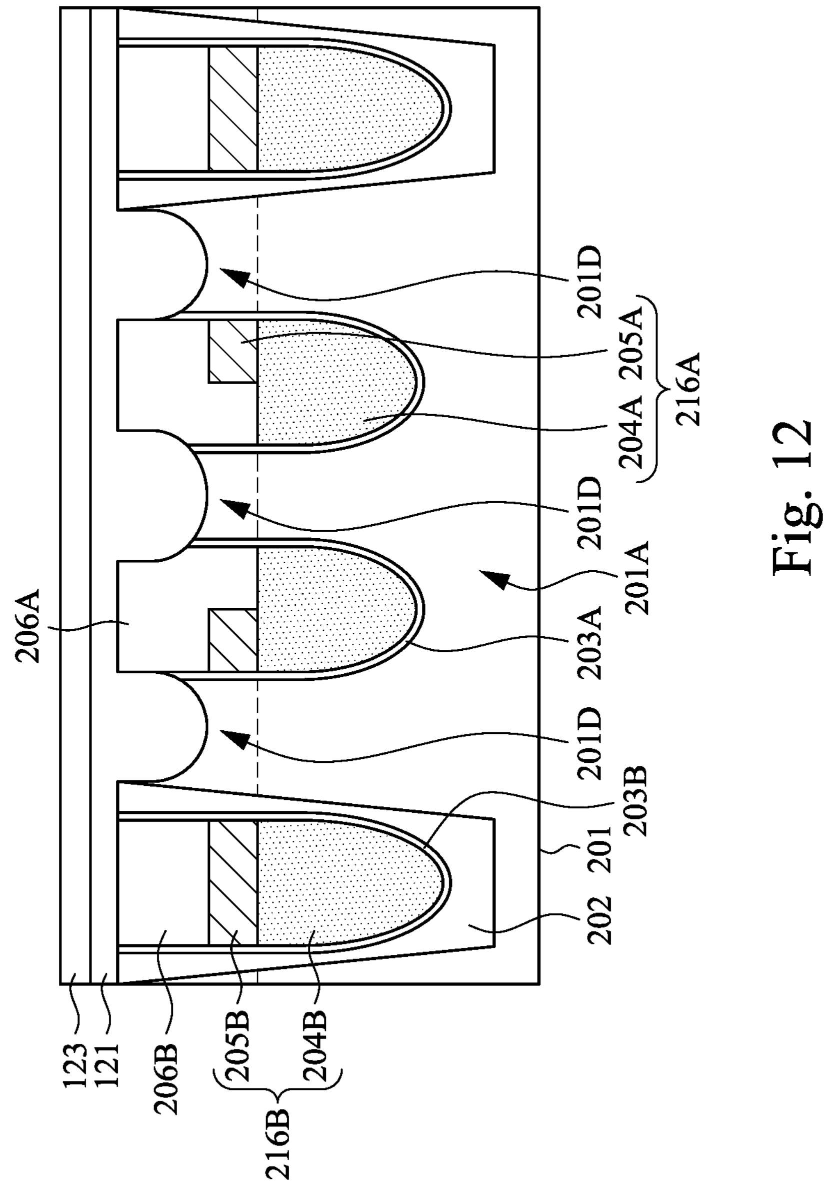

Referring to FIG. 12, a first conductive layer 121 is formed over the substrate 201, and a second conductive layer 123 is formed over the first conductive layer 121. In some embodiments, the first conductive layer 121 may fill the recesses 111A and 111B and may be in contact with the doped regions 201D. In some embodiments, the first conductive layer 121 and the second conductive layer 123 may be formed using suitable deposition process.

Figure 13:
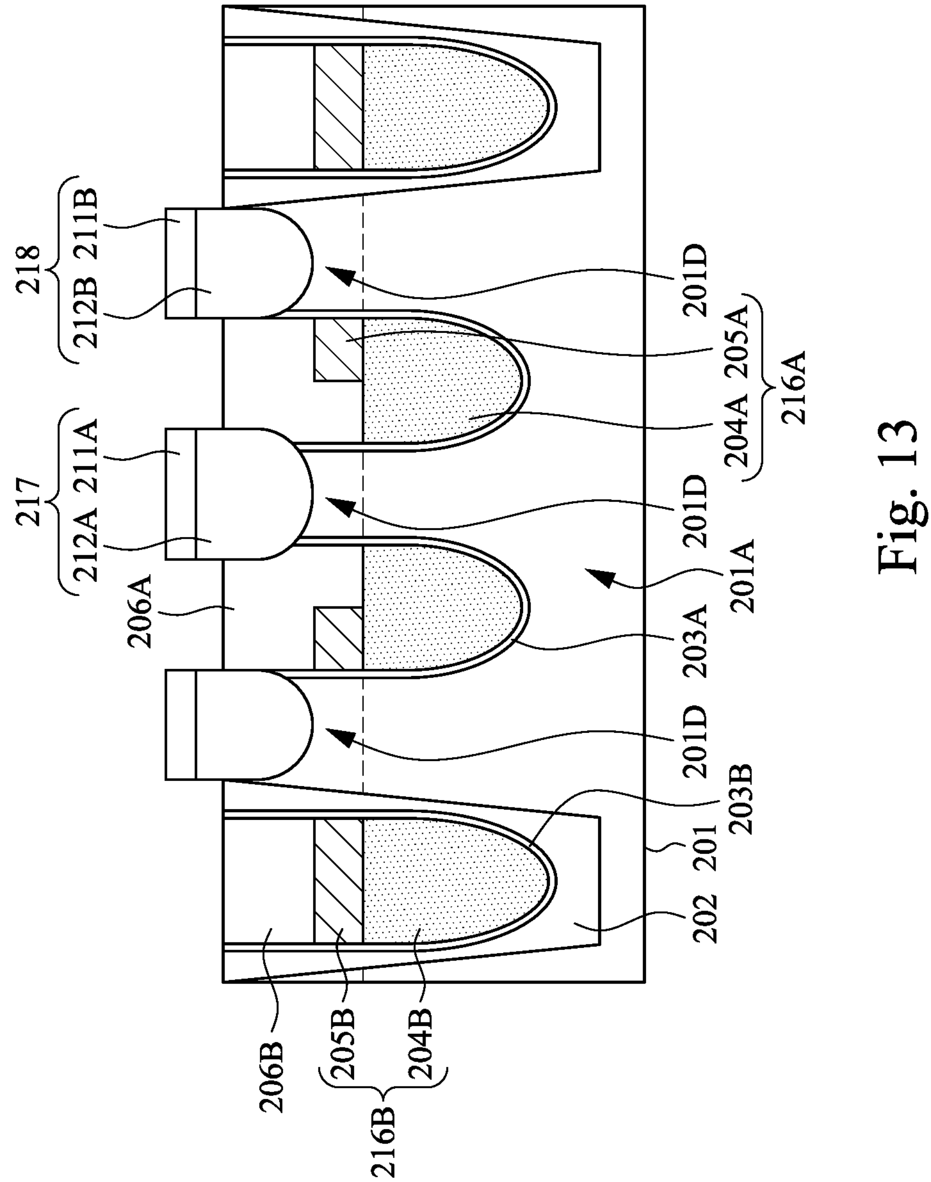

Referring to FIG. 13, the first conductive layer 121 and the second conductive layer 123 are patterned to form a bit line structure 217 and capacitor contact structures 218. In some embodiments, the bit line structure 217 includes a buried contact 212A and bit line 211A over the buried contact 212A, in which the buried contact 212A is a remaining portion of the first conductive layer 121, and the bit line 211A is a remaining portion of the second conductive layer 123. On the other hand, the capacitor contact structures 218 includes a buried contact 212B and metal contact 211B over the buried contact 212B, in which the buried contact 212B is a remaining portion of the first conductive layer 121, and the metal contact 211B is a remaining portion of the second conductive layer 123.

Figure 14:
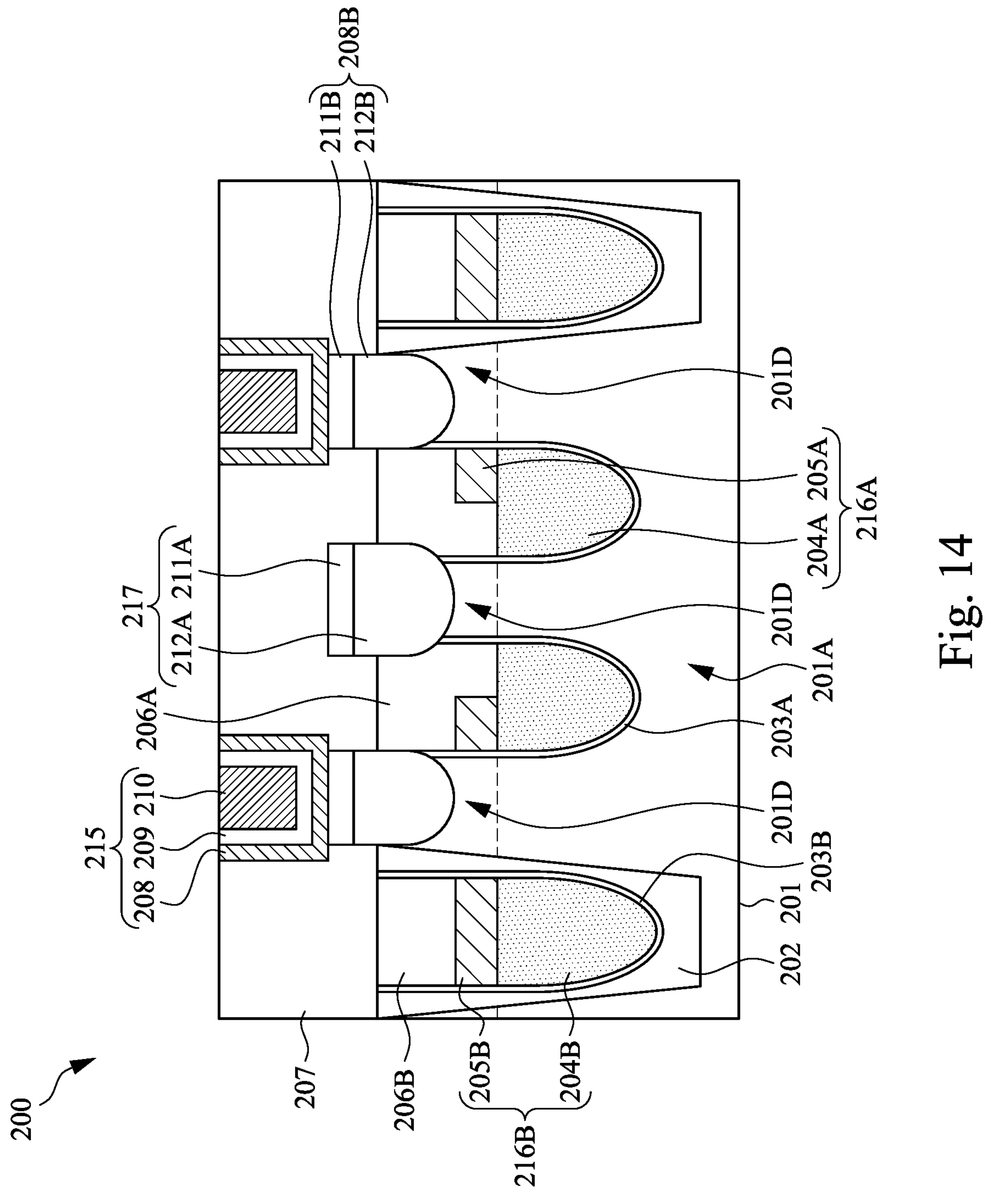

Referring to FIG. 14, a dielectric layer 207 is formed over the substrate 201 and covering the bit line structure 217 and capacitor contact structures 218. Then, capacitor structures 215 are formed in the dielectric layer 207 and in contact with the respective capacitor contact structures 218. In some embodiments, the dielectric layer 207 may be formed using suitable deposition process. In some embodiments, the capacitor structures 215 may be formed by, for example, patterning the dielectric layer 207 to forming openings exposing the capacitor contact structures 218, depositing a lower electrode 208, a middle dielectric 209, and an upper electrode 210 in the openings, and then performing a planarization process until the dielectric layer 207 is exposed.

In some embodiments, additional processes and steps may be performed to accomplish the fabrication process of the memory device. In some embodiments, additional back end of line (BEOL) processes may be performed on the memory device 200.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A memory device, comprising:

a substrate;

a first word line structure in the substrate, comprising:

a first bottom conductive material; and a first top conductive material over the first bottom conductive material, wherein a top surface of the first bottom conductive material is wider than a bottom surface of the first top conductive material;

a first dielectric layer over the first word line structure;

a dielectric liner lining the first word line structure, wherein the first top conductive material has a first sidewall and a second sidewall opposite to the first sidewall, the first sidewall is in contact with the first dielectric layer and the second sidewall is in contact with the dielectric liner; and a bit line structure over the substrate.

2. The memory device of claim 1, wherein the first dielectric layer is in contact with the first bottom conductive material.

3. The memory device of claim 1, wherein a bottom surface of the first dielectric layer is lower than a top surface of the first top conductive material.

4. The memory device of claim 1, further comprising a capacitor electrically coupled with a doped region of the substrate.

5. The memory device of claim 1, wherein a portion of the top surface of the first bottom conductive material is free of coverage by the first top conductive material.

6. The memory device of claim 1, wherein the first dielectric layer is in contact with a top surface of the first top conductive material and a sidewall of the first top conductive material.

7. The memory device of claim 1, further comprising:

an isolation structure in the substrate; and a second word line structure in the isolation structure, comprising:

a second bottom conductive material; and a second top conductive material over the second bottom conductive material, wherein a top surface of the second bottom conductive material and a bottom surface of the second top conductive material have a same width.

8. The memory device of claim 7, wherein the second top conductive material is wider than the first top conductive material.

9. The memory device of claim 7, further comprising a second dielectric layer over the second top conductive material, wherein the first dielectric layer is in contact with a portion of the first bottom conductive material, while the second dielectric layer is spaced apart from the second bottom conductive material.

* * * * *